(12) United States Patent
Ohnishi

(10) Patent No.: US 6,828,840 B2
(45) Date of Patent: Dec. 7, 2004

(54) CLOCK PULSE GENERATOR

(75) Inventor: Shinsuke Ohnishi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/397,182

(22) Filed: Mar. 27, 2003

(65) Prior Publication Data
US 2004/0090258 A1 May 13, 2004

(30) Foreign Application Priority Data
Nov. 7, 2002 (JP) ........................................ 2002-323374

(51) Int. Cl.[7] .............................................. H03H 11/26
(52) U.S. Cl. ...................................... 327/281; 327/278
(58) Field of Search ................................ 327/281, 283, 327/278, 277, 264, 263

(56) References Cited
FOREIGN PATENT DOCUMENTS

JP 48-67644 8/1973
JP 07-015297 1/1995

Primary Examiner—Linh My Nguyen
(74) Attorney, Agent, or Firm—Rabin & Berdo, P.C.

(57) ABSTRACT

A clock pulse generator includes an input terminal, an input bias setting circuit, first and second pulse shaping circuit and a pulse combining circuit. The input terminal receives a sinusoidal signal. The input bias setting circuit generates an addition sinusoidal signal having a predetermined bias voltage as a central voltage level thereof. The first and second shaping circuits are connected to the input bias setting circuit. The first shaping circuit has a first threshold voltage that is higher than the predetermined voltage and is responsive to the addition sinusoidal signal to generate a first pulse signal. The second shaping circuit has a second threshold voltage that is lower than the predetermined voltage and is responsive to the addition sinusoidal signal to generate a second pulse signal. The pulse combining circuit synchronizes either of the rising edge or the falling edge of the first pulse signal with that of the second pulse signal so as to generate an output clock pulse.

20 Claims, 6 Drawing Sheets

CLOCK PULSE GENERATOR

BACKGROUND OF THE INVENTION

The present invention relates to a clock pulse generator suitable for use in a semiconductor integrated circuit.

A conventional clock pulse generator for a semiconductor integrated circuit receives a sinusoidal signal having a small amplitude of about 400 mVpp from an external signal source through an input capacitor. An amplifier in which the input and output of an inverter is bridged with a high resistor, amplifies the sinusoidal signal. This type of amplifier has nonlinear amplification characteristics that an amplification factor in the neighborhood (at ½ of a normal source voltage in the case of a CMOS) of a threshold level (threshold value) is maximum and an amplification factor thereof also decreases as it deviates from the threshold value.

The sinusoidal signal is vibrated and amplified by the amplifier with a level (corresponding to a threshold value in the case of the CMOS) equal to one-half the source voltage as the center. The output signal amplified in this way is waveform-shaped by a pulse-shaping inverter, after which it is outputted as a clock signal.

A prior art has been also disclosed wherein three clock trees are used in a sync signal generator to prevent a malfunction based on a noise burst contained in the sinusoidal signal and thereby reliably complement a data signal (U.S. Pat. No. 6,005,412).

However, a power supply line and an earth line to which the semiconductor integrated circuit is connected, have generally been contaminated by digital noise produced by the semiconductor integrated circuit per se or its peripheral digital circuit. The digital noise is superimposed on a sinusoidal signal of small amplitude. The digital noise described herein is called fine noise superimposed on the power supply line or earth line due to a transient response caused by the rising edge or falling edge of a pulse signal.

The digital noise is also amplified by the amplifier. The digital noise is extremely and widely amplified in the neighborhood of the threshold value of the inverter in particular. Thus, when the level of the digital noise exceeds a predetermined level, a pulse shaping inverter is turned on and off due to the digital noise within one cycle of the sinusoidal signal. As a result, a problem to be solved still remains that an improper clock pulse is produced.

SUMMARY OF THE INVENTION

A clock pulse generator according to the present invention includes an input terminal, an input bias setting circuit, a threshold addition circuit, a threshold subtraction circuit and a pulse combining circuit. The input bias setting circuit adds a predetermined bias voltage to the sinusoidal signal delivered from the input terminal so as to generate an addition sinusoidal signal. The threshold voltage addition circuit shapes the addition sinusoidal signal in addition to a first threshold voltage so as to generate a first pulse signal. The threshold voltage subtraction circuit shapes the addition sinusoidal signal in subtraction to a second threshold voltage so as to generate a second pulse signal. The pulse combining circuit synchronizes either one of rising or falling edges of the first clock pulse with those of the second clock pulse so as to generate an output clock pulse.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

According to the present invention, a sinusoidal signal of small amplitude is vibrated up and down with a voltage level equal to one-half a source voltage (Vdd) as the center. This signal is waveform-shaped by using two pulse shaping circuits. A threshold value of one pulse shaping circuit is set to ½ Vdd+v1. A threshold value of the other pulse shaping circuit is set to ½ Vdd−v2. The rising edge of a clock pulse is synchronized with an output produced from one of the two pulse shaping circuits to which the threshold values have been set in this way, whereas the falling edge thereof is synchronized with an output produced from the other thereof.

Even if digital noise whose peak-to-peak is v1+v2 or less enters, the pulse shaping circuits are not operated on a digital noise-alone basis owing to such a configuration. Consideration will next be given to a case in which the digital noise is added to the sinusoidal signal of small amplitude. In this case, it is also assumed that the respective pulse shaping circuits are turned on and off plural times within one cycle of the sinusoidal signal. However, the generation of an improper clock pulse can be prevented by virtue of the following reason.

Namely, the outputs of the two pulse shaping circuits merely produce either the rising edge of the clock pulse or the falling edge thereof as described above. Thus, if the pulse shaping circuits have played such a role once within one cycle of the sinusoidal signal, such digital noise does not exert any influence upon the generation of the clock pulse till the next cycle even if the pulse shaping circuits are turned on and off plural times within the same cycle.

An embodiment of the present invention will be described below.

Figure 1:
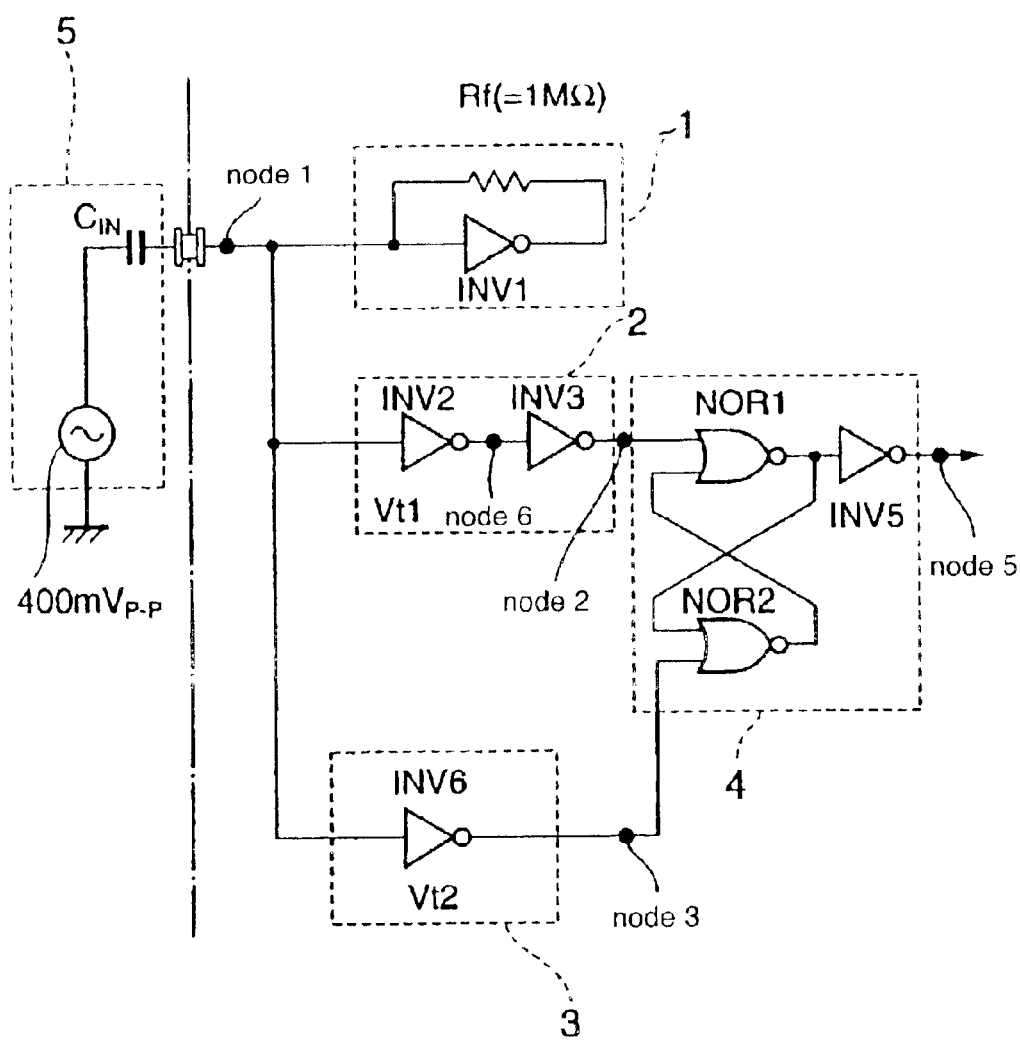
FIG. 1 is a basic configurational block diagram of the present invention.

FIG. 1 is a basic configurational block diagram of the present invention.

As is understood from the drawing, a clock pulse generator of the present invention includes an input bias setting circuit 1, a threshold-value addition pulse shaping circuit 2, a threshold-value subtraction pulse shaping circuit 3 and a pulse combining circuit 4.

The input bias setting circuit 1 is a part which receives a sine or sinusoidal wave (normally corresponding to a small amplitude sine wave of about 400 mVpp) from a sinusoidal signal generator 5 and adds a predetermined bias voltage thereto. The predetermined bias voltage is set to one-half the source voltage Vdd. As shown in the drawing, this can be obtained by bridging the input and output of an inverter INV1 with a high resistor Rf.

The threshold-value addition pulse shaping circuit 2 is a part which pulse-shapes the sinusoidal signal subsequent to addition of the bias voltage thereto with a threshold voltage obtained by adding a predetermined voltage to the bias voltage. Namely, a threshold voltage Vt1 of an inverter INV2 is changed to a value obtained by adding a predetermined voltage v1 to a threshold value Vt0 (=Vdd/2) of a normal CMOS inverter. The predetermined voltage v1 employed in the present embodiment is a hysteresis voltage set to prevent the clock pulse generator from malfunctioning due to digital noise. Incidentally, the output of the inverter INV2 is outputted after having been inverted by an inverter INV3.

The threshold-value subtraction pulse shaping circuit 3 is a part which pulse-shapes the sinusoidal signal subsequent to addition of the bias voltage thereto with a threshold voltage obtained by subtracting a predetermined voltage from the bias voltage. Namely, a threshold voltage Vt2 of an inverter INV6 is changed to a value obtained by subtracting a predetermined voltage v2 from the threshold value Vt0 (=Vdd/2) of the normal CMOS inverter. The predetermined voltage v2 employed in the present embodiment is a hysteresis voltage set to prevent the clock pulse generator from malfunctioning due to the digital noise.

The pulse combining circuit 4 is a part which causes a clock pulse to rise in synchronism with the output of the threshold-value addition pulse shaping circuit 2 and allows it to fall in synchronism with the output of the threshold-value subtraction pulse shaping circuit 3. An RS flip-flop is normally used therefor. An output of the RS flip-flop is waveform-shaped by an inverter INV5, after which it is outputted as a clock signal.

Figure 2:
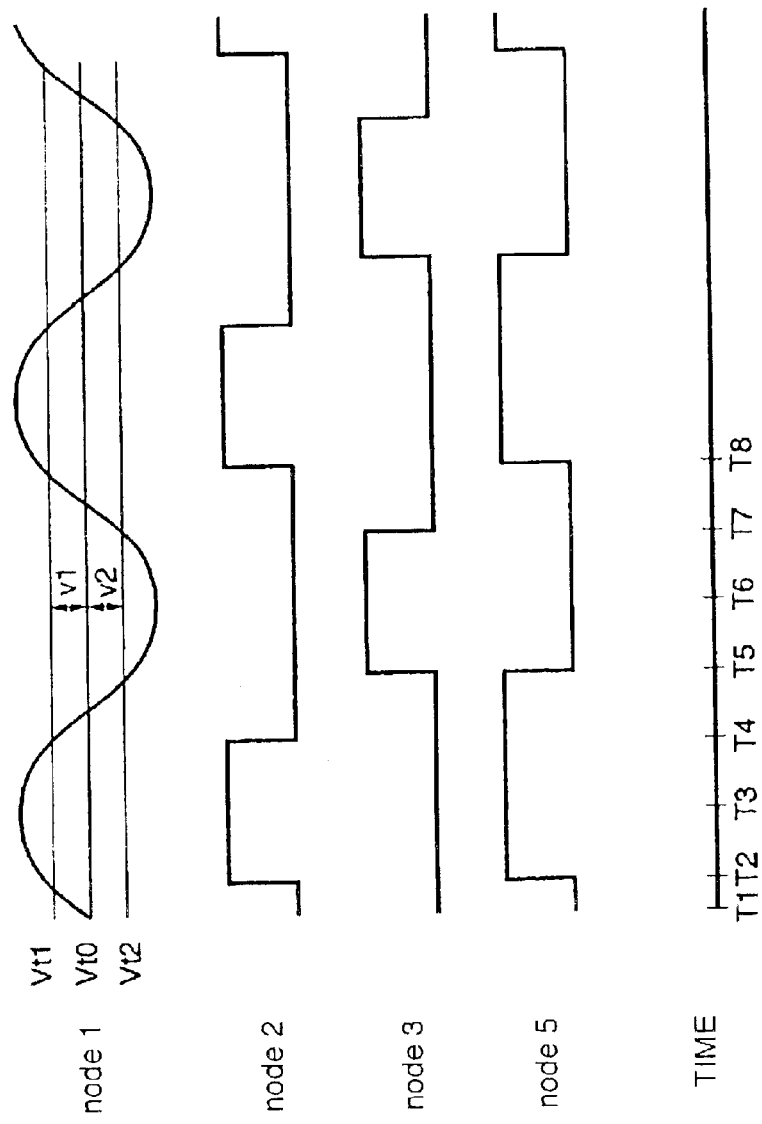
FIG. 2 is a timing chart showing operation of a clock pulse generator according to the present invention.

FIG. 2 is a timing chart for describing the operation of the clock pulse generator according to the present invention.

A voltage waveform at a node 1 (see FIG. 1), a voltage waveform at a node 2 (see FIG. 1), a voltage waveform at a node 3 (see FIG. 1), a voltage waveform at a node 5 (see FIG. 1), and times common to the respective voltage waveforms are illustrated in order from above the drawing.

The voltage waveform at the node 1 is a voltage waveform after having been obtained by allowing the input bias setting circuit 1 (see FIG. 1) to receive the output of the sinusoidal signal generator 5 (see FIG. 1) and to add a bias voltage to the output thereof. Thus, the voltage waveform shows the manner in which a small amplitude sine wave is vibrated vertically with a threshold value Vt0 (=Vdd/2) of the inverter INV1 as the center. Now, Vt1 in the drawing indicates a threshold value of the threshold-value addition pulse shaping circuit 2 (see FIG. 1), and Vt2 in the drawing indicates a threshold value of the threshold-value subtraction pulse shaping circuit 3 (see FIG. 1), respectively.

The voltage waveform at the node 2 shows a waveform obtained by, when a signal expressed in the form of the voltage waveform at the node 1 is inputted to the threshold-value addition pulse shaping circuit 2 (see FIG. 1), inverting its output by the inverter INV3 (see FIG. 1).

The voltage waveform at the node 3 indicates a waveform of an output produced from the threshold-value subtraction pulse shaping circuit 3 (see FIG. 1) when the signal expressed in the form of the voltage waveform at the node 1 is inputted to the threshold-value subtraction pulse shaping circuit 3 (see FIG. 1).

The voltage waveform at the node 5 indicates a waveform of a clock signal outputted from the pulse combining circuit 4 (see FIG. 1) in response to the output of the threshold-value addition pulse shaping circuit 2 and the output of the threshold-value subtraction pulse shaping circuit 3.

The operation of the clock pulse generator according to the present invention will be described in time order.

Time T1:

A small amplitude sinusoidal signal (node 1) is inputted to the input bias setting circuit 1 and thereafter the clock pulse generator starts its operation. At this time, the output (node 2) of the threshold-value addition pulse shaping circuit 2, the output (node 3) of the threshold-value subtraction pulse shaping circuit 3, and the output (node 5) of the pulse combining circuit 4 are all low in level (hereinafter described as "L level").

Time T2:

When the voltage level (node 1) of the small amplitude sinusoidal signal continues to increase and exceeds the threshold value Vt1 of the inverter INV2, the output (node 2) of the threshold-value addition pulse shaping circuit 2 is brought to a high level (hereinafter described as "H level"). Afterwards, the present H level is maintained. The output (node 5) of the pulse combining circuit 4 is also brought to the H level in response to the output (node 2) of the threshold-value addition pulse shaping circuit 2. Thereafter, the present H level is maintained.

Time T3:

The voltage level of the small amplitude sinusoidal signal (node 1) reaches the maximum value and changes to its decrease subsequently.

Time T4:

When the voltage level of the small amplitude sinusoidal signal (node 1) continues to decrease and falls below the threshold value Vt1 of the inverter INV2, the output of the threshold-value addition pulse shaping circuit 2 is brought to the L level. The present H level is maintained subsequently.

Time T5:

When the voltage level of the small amplitude sinusoidal signal (node 1) continues to decrease and falls below the threshold value Vt2 of the inverter INV6, the output (node 3) of the threshold-value subtraction pulse shaping circuit 3 is brought to the H level. The present H level is maintained subsequently. The output (node 5) of the pulse combining circuit 4 is brought to the L level in response to the output (node 3) of the threshold-value subtraction pulse shaping circuit 3. The present L level is maintained subsequently.

Time T6:

The voltage level of the small amplitude sinusoidal signal (node 1) reaches the minimum value and changes to its increase subsequently.

Time T7:

When the voltage level of the small amplitude sinusoidal signal (node 1) continues to increase and exceeds the threshold value Vt2 of the inverter INV6, the output (node 3) of the threshold-value addition pulse shaping circuit 3 is brought to the L level. The present L level is maintained subsequently.

Time T8:

When the voltage level (node 1) of the small amplitude sinusoidal signal continues to increase and exceeds the threshold value Vt1 of the inverter INV2, the output (node 2) of the threshold-value addition pulse shaping circuit 2 goes the H level. Thereafter, the present H level is held. The output (node 5) of the pulse combining circuit 4 is also brought to the H level in response to the output (node 2) of the threshold-value addition pulse shaping circuit 2. The present H level is maintained subsequently. The operation similar to the above is subsequently repeated.

From the above result, the pulse combining circuit 4 includes a non-operated region, i.e., a hysteresis region in a range of +v1 to −v2. Accordingly, a noise level does not exert a bad influence on the operation of the pulse combining circuit 4 as long as its peak-to-peak falls within the range of v1+v2. Consideration will be given to a case in which the digital noise is added to the small amplitude sinusoidal signal.

In this case, there is a possibility that a level obtained by adding the digital noise to the small amplitude sinusoidal signal will fluctuate with the level of the threshold value Vt1 of the inverter INV2 in the neighborhood of the time T2. At this time, the waveform at the node 2 fluctuates between the H and L levels plural times in the vicinity of the time T2 (not shown). Since, however, the waveform at the node 2 has only the role of raising the waveform at the node 5, no bad influence is exerted on the above operation till the time T8 at which the following cycle starts, once the waveform at the node 5 rises.

Actual circuit examples will next be explained.

Figure 3:
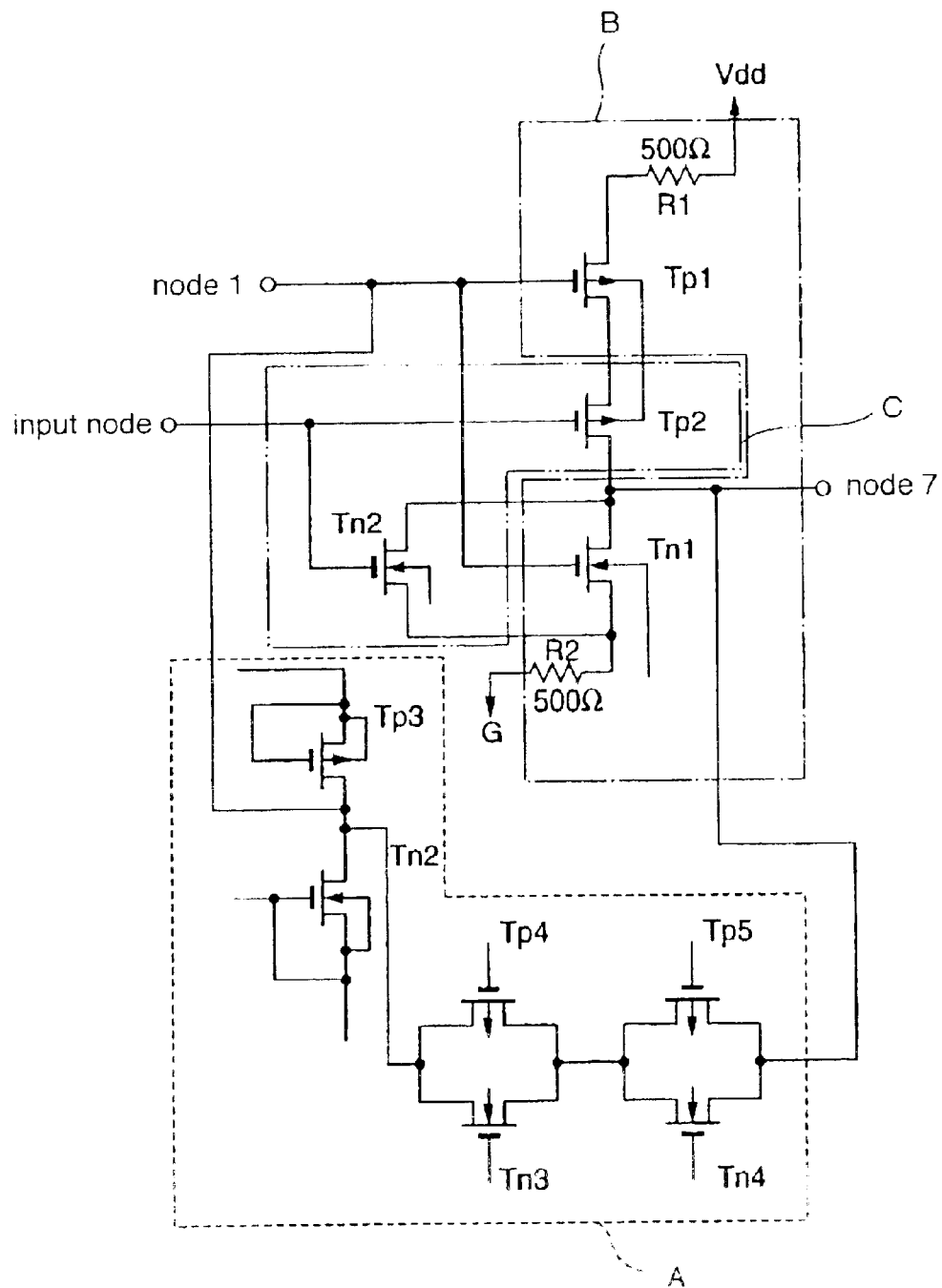
FIG. 3 is a circuit diagram of an input bias setting circuit.

FIG. 3 is a circuit diagram of an input bias setting circuit.

The drawing illustrates an actual circuit example of an input bias setting circuit 1 (refer to FIG. 1) where the present invention is implemented on an IC substrate.

As shown in the drawing, the input bias setting circuit 1 has a transistor group A, a transistor group B and a transistor group C. Theses transistor groups will be individually described.

The transistor group A is a part corresponding to Rf (see FIG. 1) for bridging nodes 1 and 7. A transistor Tp3 and a transistor Tn2 constitute a protection circuit for preventing electrostatic breakdown or the like and constitutes a part having no direct bearing on the operation of the present invention. A transistor Tp4, a transistor Tp5, a transistor Tn3 and a transistor Tn4 are parts which determine a resistance value of Rf (see FIG. 1), based on their on resistances.

The transistor group B is a part corresponding to the inverter INV1 (see FIG. 1). In the normal operating condition, a transistor Tp2 (which belongs to the transistor group C) is set to an on state. Thus, a transistor array comprising a transistor Tp1 and a transistor Tn1 is connected to a source voltage Vdd through a source resistor R1 and connected to Ground through a ground resistor R2 thereby to constitute an inverter. Now, the source resistor R1 and the ground resistor R2 are current limiting resistors which respectively restrict currents that flow through the transistor Tp1 and the transistor Tn1. An input node of such an inverter is connected to a node 1, and an output node thereof is connected to a node 7, respectively.

The transistor group C is a power down control circuit of the inverter. This is a circuit which restricts a current flowing through the inverter in the absence of signal input (in the case of a non-operating condition), for example, to thereby reduce current consumption of the IC. Since the present circuit has no direct bearing on the present invention, it is a part uncontained in FIG. 1. A summary of the operation of the transistor group C will be explained.

In the normal operating condition of the inverter, a power down input node shown in the drawing is set to an L level. Thus, the transistor Tp2 is held in an on state and the transistor Tn2 is held in an off state. When no signal input is made to the node 1 (non-operating condition), a power down signal of an H level is applied to the power down input node. At this time, the transistor Tp2 is changed to an off state and the transistor Tn2 is changed to an on state. As a result, the current that flows through the inverter INV1, is substantially reduced.

FIG. 4 is a circuit diagram of a pulse shaping section. FIG. 4 shows actual circuit examples of the threshold-value addition pulse shaping circuit 2 (see FIG. 1), the threshold-value subtraction pulse shaping circuit 3 (see FIG. 1), and the pulse combining circuit 4 (see FIG. 1) where the present invention is implemented on the IC substrate.

Figures 4A, 4B:
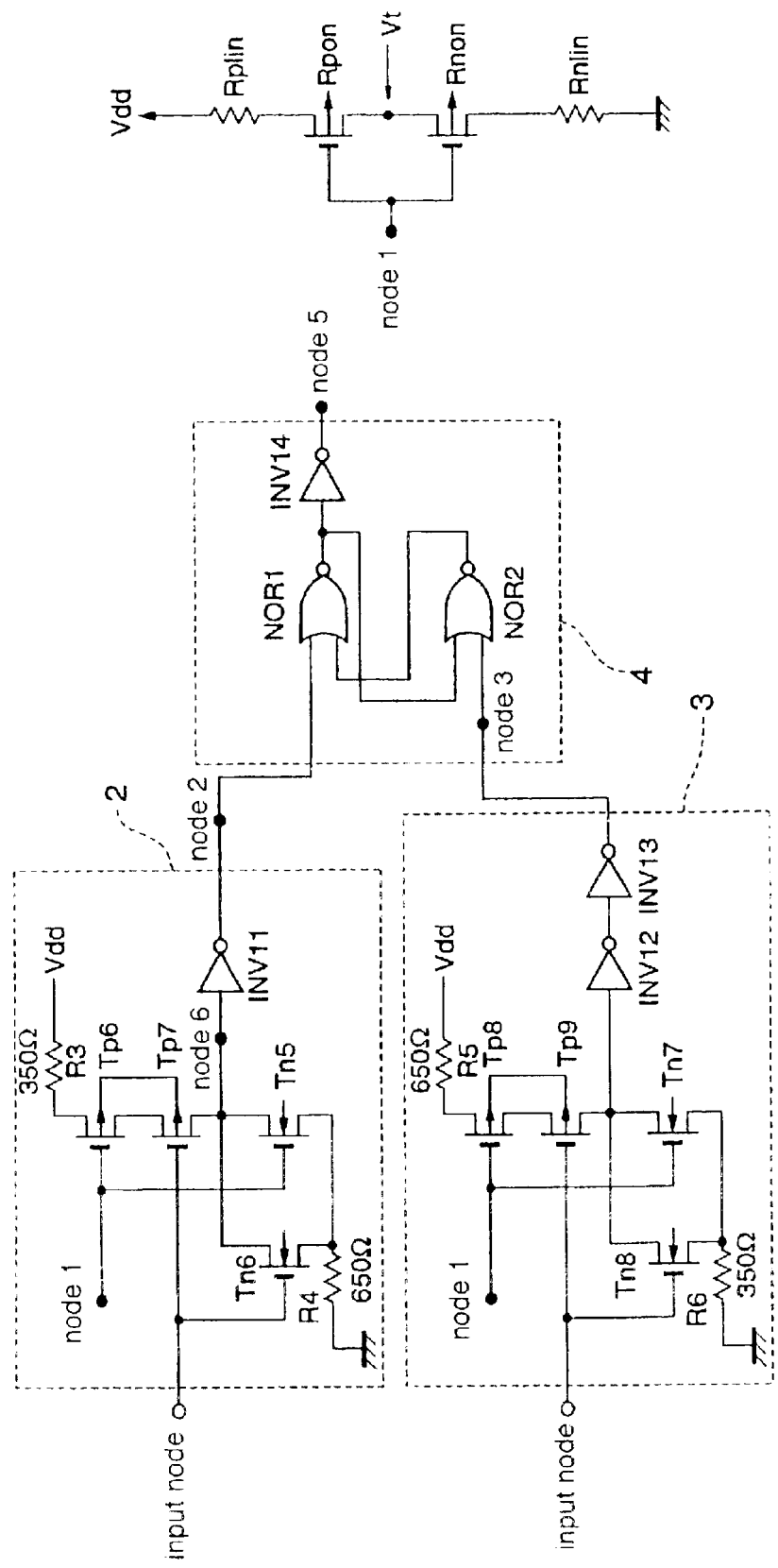
FIGS. 4(a) and 4(b) are respectively circuit diagrams showing a pulse shaping section.

FIG. 4(a) shows a circuit diagram, and FIG. 4(b) is an explanatory diagram of a threshold value calculation expression.

As is understood from the drawing, the threshold-value addition pulse shaping circuit 2 constitutes an inverter (corresponding to the INV2 shown in FIG. 1) wherein a transistor array comprising a transistor Tp6 and a transistor Tn5 is connected to a source voltage Vdd through a source resistor R3 and connected to ground through a ground resistor R4. Since the inverter described above is perfectly identical in configuration to one described in the input bias setting circuit 1, the description thereof will be omitted.

Here, the source resistor R3 and the ground resistor R4 are current limiting resistors which respectively restrict currents that flow through the transistor Tp6 and the transistor Tn5, and are parts for setting the threshold value of the present inverter.

An input node of the inverter (corresponding to the INV2 shown in FIG. 1) is connected to a node 1, and its output node is connected to a node 6, respectively. Further, a transistor Tp7 and a transistor Tn6 constitute a power down control circuit for the inverter. This is a circuit which restricts a current flowing through the inverter in the absence of signal input at the node 1, for example, thereby to cut down current consumption of an IC. Since the inverter described above is perfectly identical in configuration to one described in the input bias setting circuit 1, the description thereof will be omitted. On the other hand, an inverter INV11 is an inverter which inverts a waveform at the node 6 and thereby pulse-shapes it, and is a part corresponding to the inverter INV3 shown in FIG. 1.

A method of setting the threshold value of the present inverter will next be described.

Referring to FIG. 4(b), $R_{plim}$ corresponds to the source resistor R3 shown in FIG. 4(a), $R_{pon}$ corresponds to an on-resistance of the transistor Tp6 shown in FIG. 4(a), $R_{non}$ corresponds to an on-resistance of the transistor Tn5 shown in FIG. 4(a), and $R_{plim}$ corresponds to the ground resistor R4 shown in FIG. 4(a), respectively. Using these resistors, Vt is expressed by the following expression:

$$Vt = Vdd \times (R_{non} + R_{nlim})/(R_{plim} + R_{pon} + R_{non} + R_{nlim}) \qquad (1)$$

Thus, a threshold voltage Vt1 results in Vt1=Vdd×(on-resistance of transistor Tn5+R4 )/(R4+one-resistance of transistor Tn5+on-resistance of transistor Tp6+R3 ) from the expression (1). Namely, the values of R4 and R3 are increased and decreased to thereby make it possible to easily set the threshold voltage Vt1.

The threshold-value subtraction pulse shaping circuit 3 constitutes an inverter (corresponding to the INV6 shown in FIG. 1) wherein a transistor array comprising a transistor Tp8 and a transistor Tn7 is connected to the source voltage Vdd through a source resistor 5 and tied to ground through a ground resistor R6. Since the inverter described above is perfectly identical in configuration to one described in the input bias setting circuit 1, the description thereof will be omitted.

Here, the source resistor R5 and the ground resistor R6 are current limiting resistors which respectively restrict currents that flow through the transistor Tp8 and the transistor Tn7, and are parts for setting the threshold value of the present inverter.

An input node of the inverter (corresponding to the INV6 shown in FIG. 1) is connected to a node 1, and its output node is connected to an inverter INV12, respectively. Further, a transistor Tp9 and a transistor Tn8 constitute a power down control circuit for the inverter. This is a circuit which restricts a current flowing through the inverter in the absence of signal input at the node 1, for example, thereby to cut down or reduce current consumption of the IC. Since the inverter described above is perfectly identical in configuration to one described in the input bias setting circuit 1, the description thereof will be omitted. On the other hand, the inverter INV12 and an inverter INV13 connected in tandem are parts which serve as buffers for pulse-shaping the output of the present inverter. They are parts not described in FIG. 1.

A method of setting the threshold value of the present inverter will next be described. Referring to FIG. 4(b), $R_{plim}$ corresponds to the source resistor R5 shown in FIG. 4(a), $R_{pon}$ corresponds to an on-resistance of the transistor Tp8 shown in FIG. 4(a), $R_{non}$ corresponds to an on-resistance of the transistor Tn7 shown in FIG. 4(a), and $R_{plim}$ corresponds to the ground resistor R6 shown in FIG. 4(a), respectively.

Thus, a threshold voltage Vt2 results in Vt2=Vdd×(on-resistance of transistor Tn7+R6)/(R6+one-resistance of transistor Tn7+on-resistance of transistor Tp8+R5) from the expression (1). Namely, the values of R6 and R5 are increased and decreased to thereby make it possible to easily set the threshold voltage Vt2.

The pulse combining circuit 4 is a part which synchronizes the rising edge of a clock pulse with the rising edge of an output produced from the threshold-value addition pulse shaping circuit 2 and synchronizes the falling edge of the clock pulse with the rising edge of an output produced from the threshold-value subtraction pulse shaping circuit 3 to thereby output the corresponding clock pulse.

The pulse combining circuit 4 includes an RS flip-flop comprising a NOR gate NOR1 and a NOR gate NOR2, and an inverter INV14 for pulse-shaping a pulse (clock pulse) outputted therefrom.

A test result of the clock pulse generator according to the present invention as described above will be explained.

Figure 5:
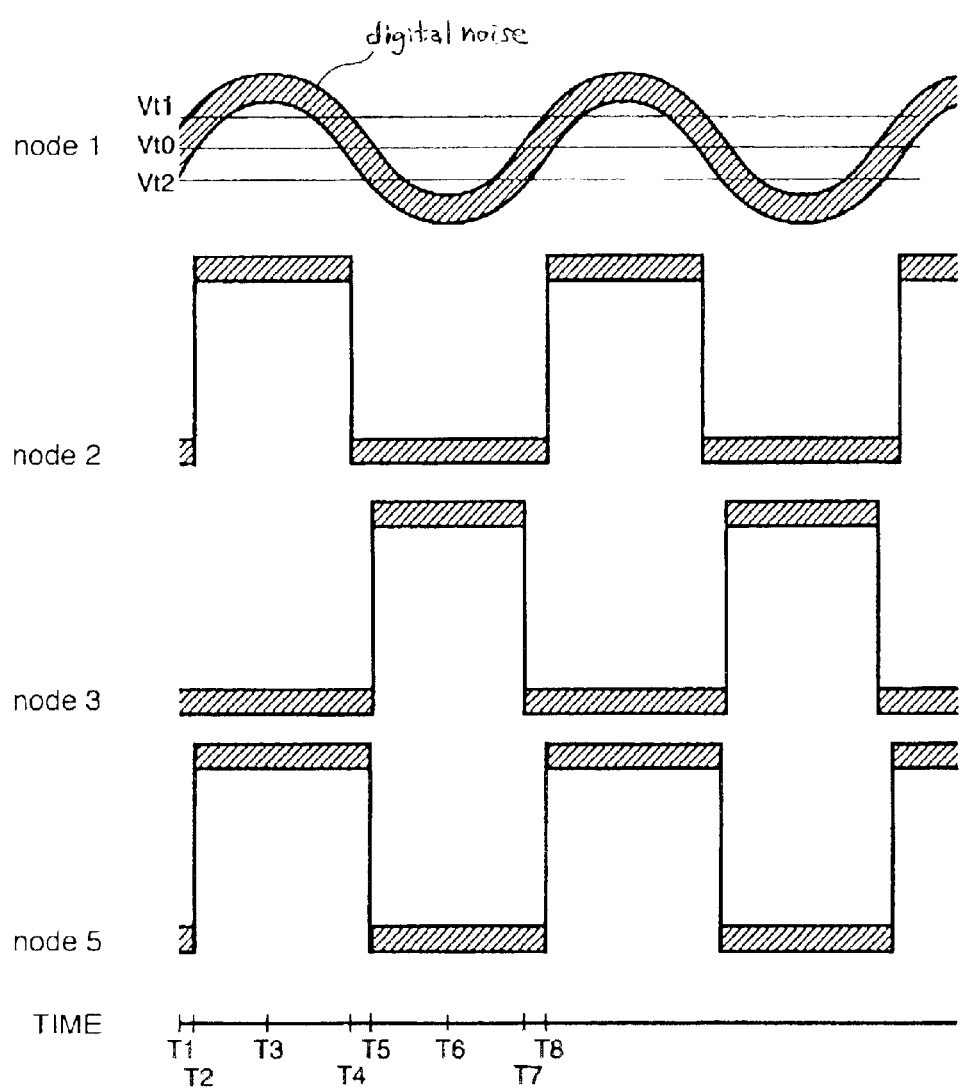
FIG. 5 is a timing chart showing another operation of the clock pulse generator according to the present invention.

FIG. 5 is a timing chart for describing the operation of the clock pulse generator according to the present invention.

A voltage waveform at the node 1 (see FIG. 3 or 4), a voltage waveform at a node 2 (see FIG. 4), a voltage waveform at a node 3 (see FIG. 4), a voltage waveform at a node 5 (see FIG. 4), and times common to the respective voltage waveforms are illustrated in order from above the drawing.

The voltage waveform at the node 1 is a voltage waveform after having been obtained by allowing the input bias setting circuit 1 (see FIG. 3) to receive the output of the sinusoidal signal generator 5 (see FIG. 1) and to add a bias voltage to the output thereof. Thus, the voltage waveform shows the manner in which a small amplitude sine wave is vibrated vertically with a bias voltage (=Vdd/2) as the center and digital noise is mixed into the small amplitude sine wave. Now, Vt1 in the drawing indicates a threshold value of the threshold-value addition pulse shaping circuit 2 (see FIG. 4), and Vt2 in the drawing indicates a threshold value of the threshold-value subtraction pulse shaping circuit 3 (see FIG. 4), respectively.

The voltage waveform at the node 2 shows a waveform obtained by, when a signal expressed in the form of the voltage waveform at the node 1 is inputted to the threshold-value addition pulse shaping circuit 2 (see FIG. 4), inverting its output by the inverter INV11 (see FIG. 4).

The voltage waveform at the node 3 indicates a waveform after having been obtained by, when a signal expressed in the form of the voltage waveform at the node 1 is inputted to the threshold-value subtraction pulse shaping circuit 3 (see FIG. 1), waveform-shaping its output by a buffer comprising the cascade-connected inverter INV12 and inverter INV13.

The voltage waveform at the node 5 indicates a waveform of a clock signal outputted from the pulse combining circuit 4 (see FIG. 4) in response to the output of the threshold-value addition pulse shaping circuit 2 (see FIG. 4) and the output of the threshold-value subtraction pulse shaping circuit 3 (see FIG. 4).

As shown in the drawing, the output (node 2) of the threshold-value addition pulse shaping circuit 2 is changed to an H level at a time T2 at which the level of a signal expressed in the form of the small amplitude sinusoidal wave mixed with the digital noise has exceeded the threshold value Vt1. Further, the output thereof is changed to an L level at a time T4 at which the level falls below the threshold value Vt1. The output (node 3) of the threshold-value subtraction pulse shaping circuit 3 is changed to an H level at a time T5 at which the level of the signal expressed in the form of the small amplitude sinusoidal wave mixed with the digital noise falls below the threshold value Vt2. The output thereof is changed to an L level at a time T7 at which the level thereof has exceeded the threshold value Vt2. Further, the output (node 5) of the pulse combining circuit 4 is changed to an H level in synchronism with the rising edge of the output (node 2) of the threshold-value addition pulse shaping circuit 2 and to an L level in synchronism with the rising edge of the output (node 3) of the threshold-value pulse shaping circuit 3.

Thus, when the level of the signal expressed in the form of the small amplitude sinusoidal wave mixed with the digital noise is lower than the threshold value Vt1 and higher than the threshold value Vt2, the clock pulse generator is not operated. The output (node 2) of the threshold-value addition pulse shaping circuit 2 assumes only the role of changing the output (node 5) of the pulse combining circuit 4 to an H level but unassumes the role of changing it to an L level. Thus, even if the output (node 2) of the threshold-value addition pulse shaping circuit 2 travels between the H and L levels plural times in the neighborhood of the time T2 due to the digital noise, the output (node 5) of the pulse combining circuit 4 is changed to the H level once and thereafter its state is continuously maintained.

Further, the output (node 3) of the threshold-value subtraction pulse shaping circuit 3 assumes only the role of changing the output (node 5) of the pulse combining circuit 4 to the L level but unassumes the role of changing the output thereof to the H level. Thus, even if the output (node 3) of the threshold-value subtraction pulse shaping circuit 3 travels between the H and L levels plural times in the neighborhood of the time T5 due to the digital noise, the output (node 4) of the pulse combining circuit 4 is changed to the L level once and thereafter its state is continuously maintained.

In the above description, the on-resistance of each transistor is handled as invariable. Changing the value of the resistor connected to the drain or source of the transistor array realizes the setting of each threshold value. However, the present invention is not limited to this example. Namely, the setting of the threshold value can also be performed by making invariable the value of the resistor connected to the drain or source of the transistor array or increasing or decreasing the on-resistance of each transistor without connecting the resistors. The principle of such an operation will be explained below.

FIG. 6 is a diagram showing the principle of threshold-value addition and subtraction.

Figure 6A:
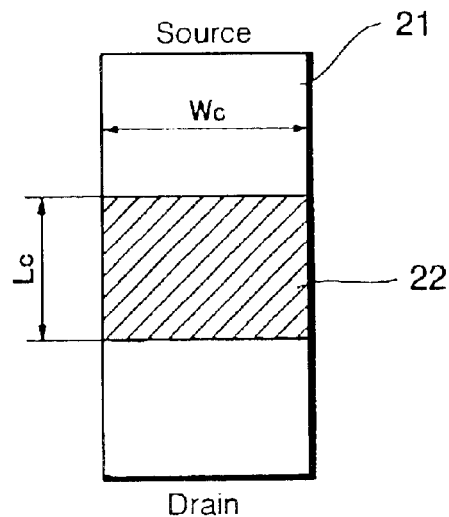
FIGS. 6(a) and 6(b) are respectively diagrams showing the principle of threshold-value addition and subtraction.
Figure 6B:
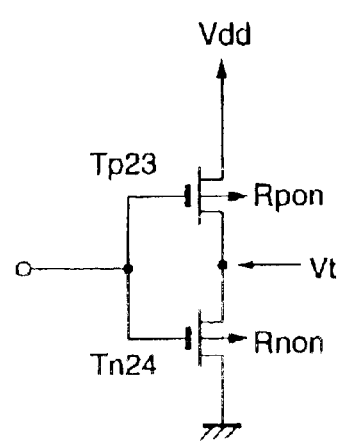

FIG. 6(a) is a plan view for describing the correlation between a diffusion region 21 and a gate electrode 22 on an IC substrate, and FIG. 6(b) is an explanatory view of a threshold value calculation expression, respectively.

Assuming that a channel length Lc is constant, the on-resistance of each transistor can be decreased by setting a channel width Wc large as is understood from FIG. 6(a). Similarly, the on-resistance thereof can be increased by setting the channel length long assuming that the channel width Wc is constant.

From the above result, a threshold value of an inverter shown in FIG. 6(b) can be determined from an on-resistance $R_{pon}$ of a transistor Tp23 and an on-resistance $R_{non}$ of a transistor Tn24 as follows:

$$Vt = Vdd \times R_{non}/(R_{pon}+R_{non}) \quad \text{(expression 2)}$$

As described above, a sinusoidal signal of small amplitude is vertically vibrated with a voltage level equal to one-half Vdd (source voltage) as the center. This signal is waveform-shaped by two pulse shaping circuits. A threshold value of one of the pulse shaping circuits is set to ½ Vdd+v1, and a threshold value of the other thereof is set to ½ Vdd−v2, respectively. The rising edge of a clock pulse is synchronized with the output of one of the two pulse shaping circuits, and the falling edge of the clock pulse is synchronized with the output of the other thereof, whereby the following advantageous effects can be obtained.

An advantageous effect can be obtained in that even if digital noise whose peak-to-peak is v1+v2 or less, enters, the pulse shaping circuits are not operated on a digital noise-alone basis.

Another advantageous effect can be obtained in that even when digital noise is added to a sinusoidal signal of small amplitude and the respective pulse shaping circuits are turned on and off plural times within one cycle of the sinusoidal signal, a malfunction-free accurate clock pulse can be obtained.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A clock pulse generator comprising:

an input terminal for receiving a sinusoidal signal;

an input bias setting circuit connected to the input terminal, the input bias setting circuit generating an addition sinusoidal signal having predetermined bias voltage as a central voltage level thereof;

a first pulse shaping circuit connected to the input bias setting circuit, the first pulse shaping circuit having a first threshold voltage that is higher than the predetermined voltage and is responsive to the addition sinusoidal signal to generate a first pulse signal;

a second pulse shaping circuit connected to the input bias setting circuit, the second pulse shaping circuit having a second threshold voltage that is lower than the predetermined voltage and is responsive to the addition sinusoidal as to generate a second pulse signal; and a pulse combining circuit connected to the first and second pulse shaping circuits, the pulse combining circuit synchronizing either of a rising edge or a falling edge of the first pulse signal with that of the second pulse signal so as to generate an output clock pulse.

2. A clock pulse generator according to claim 1, wherein the input bias setting circuit includes an inverter and a resistor.

3. A clock pulse generator according to claim 2, wherein the input bias setting circuit further includes a power down circuit connected to the inverter for enabling the inverter in response to a power down signal.

4. A clock pulse generator according to claim 1, wherein the predetermined bias voltage is about a half of a power supply voltage.

5. A clock pulse generator according to claim 1, wherein the first pulse shaping circuit includes an inverter having a threshold voltage equal to the first threshold voltage.

6. A clock pulse generator according to claim 5, wherein the first pulse shaping circuit further includes a power down circuit connected to the inverter for enabling the inverter in response to a power down signal.

7. A clock pulse generator according to claim 1, wherein the second pulse shaping circuit includes an inverter having a threshold voltage obtained by subtracting the second threshold voltage from an original threshold voltage of the inverter.

8. A clock pulse generator according to claim 7, wherein the second pulse shaping circuit further includes a power down circuit connected to the inverter for enabling the inverter in response to a power down signal.

9. A clock pulse generator comprising:

an input bias setting circuit receiving a sinusoidal signal, the input bias setting circuit generating an addition sinusoidal signal having a predetermined bias voltage as a central voltage level of the addition sinusoidal signal:

first pulse generating circuit connected to the input bias setting circuit, the first pulse shaping circuit shaping the addition sinusoidal signal at a level of a first threshold voltage that is higher than the bias voltage and is responsive to the addition sinusoidal signal to generate a first pulse signal;

a second pulse generating circuit connected to the input bias setting circuit, the second pulse generating circuit shaping the addition sinusoidal signal at a level of a second threshold voltage that is lower than the bias voltage and is responsive to the addition sinusoidal signal to generate a second pulse signal; and a pulse combining circuit connected to the first and second pulse generating circuit the pulse combining circuit generating an output clock pulse in response to either of a rising edge or a falling edge of the first pulse signal and that of the second pulse signal.

10. A clock pulse generator according to claim 9, wherein the input bias setting circuit includes an inverter and a resistor.

11. A clock pulse generator according to claim 10, wherein the input bias setting circuit further includes a power down circuit connected to the inverter for enabling the inverter in response to a power down signal.

12. A clock pulse generator according to claim 9, wherein the predetermined bias voltage is about a half of a power supply voltage.

13. A clock pulse generator according to claim 9, wherein the first pulse generating circuit includes an inverter having a threshold voltage equal to the first threshold voltage.

14. A clock pulse generator according to claim 13, wherein the first pulse generating circuit further includes a power down circuit connected to the inverter for enabling the inverter in response to a power down signal.

15. A clock pulse generator according to claim 9, wherein the second pulse generating circuit includes an inverter having a threshold voltage equal to the second threshold voltage.

16. A clock pulse generator according to claim 9, wherein the second pulse generating circuit further includes a power down circuit connected to the inverter for enabling the inverter in response to a power down signal.

17. A clock pulse generator comprising an input bias setting circuit for generating a biased sinusoidal signal;

a first pulse generating circuit for shaping the biased sinusoidal signal based on a first threshold voltage that is higher than a predetermined bias voltage and is responsive to the biased sinusoidal signal, to generate a first pulse signal;

a second generating circuit for shaping the biased sinusoidal signal based on a second threshold voltage that is lower than the predetermined bias signal; and voltage and is responsive to the biased sinusoidal signal to generate a second pulse signal; and a pulse combining circuit for generating an output clock pulse based on either one of rising or falling edge of the first pulse signal and those of the second pulse signal.

18. A clock pulse generator according to claim 17, wherein the bias voltage is about a half of a power supply voltage.

19. A clock pulse generator according to claim 17, wherein the first pulse generating circuit includes an inverter having a threshold voltage equal to the first threshold voltage.

20. A clock pulse generator according to claim 17, wherein the second pulse generating circuit includes an inverter having a threshold voltage equal to the second threshold voltage.

* * * * *